(12) United States Patent
Lin et al.

(10) Patent No.: US 9,685,374 B1
(45) Date of Patent: Jun. 20, 2017

(54) CONTACT PROCESS FLOW

(71) Applicant: Applied Materials, Inc., Santa Clara, CA (US)

(72) Inventors: Sankuei Lin, Cupertino, CA (US); Ajay Bhatnagar, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/096,997

(22) Filed: Apr. 12, 2016

Related U.S. Application Data

(60) Provisional application No. 62/294,776, filed on Feb. 12, 2016.

(51) Int. Cl.
*H01L 21/00* (2006.01)
*H01L 23/00* (2006.01)
(Continued)

(52) U.S. Cl.
CPC .. *H01L 21/76897* (2013.01); *H01L 21/76805* (2013.01); *H01L 21/76829* (2013.01); *H01L 21/823814* (2013.01); *H01L 21/823821* (2013.01); *H01L 21/823871* (2013.01); *H01L 21/823878* (2013.01); *H01L 23/535* (2013.01);
(Continued)

(58) Field of Classification Search
CPC ..... H01L 23/535; H01L 23/481; H01L 23/52; H01L 27/0924; H01L 27/0207; H01L 27/14636; H01L 29/0847; H01L 29/161; H01L 29/1608; H01L 29/165; H01L 29/24; H01L 29/267; H01L 29/7848; H01L 29/0653; H01L 21/76897; H01L 21/823821; H01L 21/823814; H01L 21/823878; H01L 21/823871; H01L 21/76805; H01L 21/76829; H01L 2029/7858

See application file for complete search history.

(56) References Cited

U.S. PATENT DOCUMENTS 9,159,794 B2  10/2015  Yu et al.
2014/0001520 A1*  1/2014  Glass ............... H01L 29/66439
                                         257/288

(Continued)

OTHER PUBLICATIONS

Huang et all, Hafnium-based High-k gate Dielectrics, 2015 (published on Nov. 21, 2015 at http://cdn.intechweb.org/pdfs/9848.pdf).*

*Primary Examiner* — Nikolay Yushin
(74) *Attorney, Agent, or Firm* — Patterson + Sheridan, LLP

(57) ABSTRACT

Embodiments described herein generally relate to forming a semiconductor structure. In one embodiment, a method of forming a semiconductor structure is formed herein. The method includes exposing an oxide layer of the semiconductor structure, depositing a polysilicon layer on the semiconductor structure, filling a first gap formed by exposing the oxide layer, depositing a hard mask on the polysilicon layer, selectively removing the hard mask and the polysilicon layer, depositing an oxide layer on the semiconductor structure, filling a second gap formed by selectively removing the hard mask and polysilicon layer, exposing the polysilicon layer deposited on the semiconductor structure, selectively removing the polysilicon layer from the first gap, and selectively removing an etch stop layer from a surface of a contact in the semiconductor structure.

20 Claims, 7 Drawing Sheets

(51) Int. Cl.
*H01L 27/00* (2006.01)
*H01L 29/00* (2006.01)
*H01L 21/768* (2006.01)
*H01L 21/8238* (2006.01)
*H01L 27/092* (2006.01)
*H01L 29/08* (2006.01)
*H01L 29/06* (2006.01)
*H01L 29/161* (2006.01)
*H01L 29/16* (2006.01)
*H01L 29/165* (2006.01)
*H01L 29/24* (2006.01)
*H01L 29/267* (2006.01)
*H01L 29/78* (2006.01)
*H01L 23/535* (2006.01)

(52) U.S. Cl.
CPC ...... *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/7848* (2013.01); *H01L 2029/7858* (2013.01)

(56) References Cited

U.S. PATENT DOCUMENTS

2015/0255604 A1    9/2015   Yang
2015/0303118 A1   10/2015   Wang et al.

\* cited by examiner

CONTACT PROCESS FLOW

CROSS-REFERENCE TO RELATED APPLICATIONS

This application claims priority from U.S. Provisional Application Ser. No. 62/294,776 filed Feb. 12, 2016, which is hereby incorporated by reference in its entirety.

BACKGROUND

Field

Embodiments described herein relate to a semiconductor device and a method for forming the same.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

Thus, there is a need for improved integrated circuits (i.e., semiconductor devices) and method for manufacturing the same.

SUMMARY

Embodiments described herein generally relate to forming a semiconductor structure. In one embodiment, a method of forming a semiconductor structure is formed herein. The method includes exposing an oxide layer of the semiconductor structure, depositing a polysilicon layer on the semiconductor structure, filling a first gap formed by exposing the oxide layer, depositing a hard mask on the polysilicon layer, selectively removing the hard mask and the polysilicon layer, depositing an oxide layer on the semiconductor structure, filling a second gap formed by selectively removing the hard mask and polysilicon layer, exposing the polysilicon layer deposited on the semiconductor structure, selectively removing the polysilicon layer from the first gap using a fluorine or chlorine-containing precursor and a hydrogen-containing precursor, and selectively removing an etch stop layer from a surface of a contact in the semiconductor structure, using a fluorine or chlorine-containing precursor and a hydrogen-containing precursor In another embodiment, a semiconductor structure is disclosed herein. The semiconductor structure includes a plurality of contacts. Each contact includes a top surface and a second surface. The top surface and the second surface are exposed such that a metal layer may contact the top surface and the second surface of the contact.

In another embodiment, another method of forming a semiconductor structure is disclosed herein. The method includes forming a plurality of wrap-around contacts by selectively removing a polysilicon layer and an etch stop layer from the semiconductor structure using a fluorine or chlorine-containing precursor and a hydrogen-containing precursor exposing a top surface and a bottom surface of a contact in the semiconductor structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
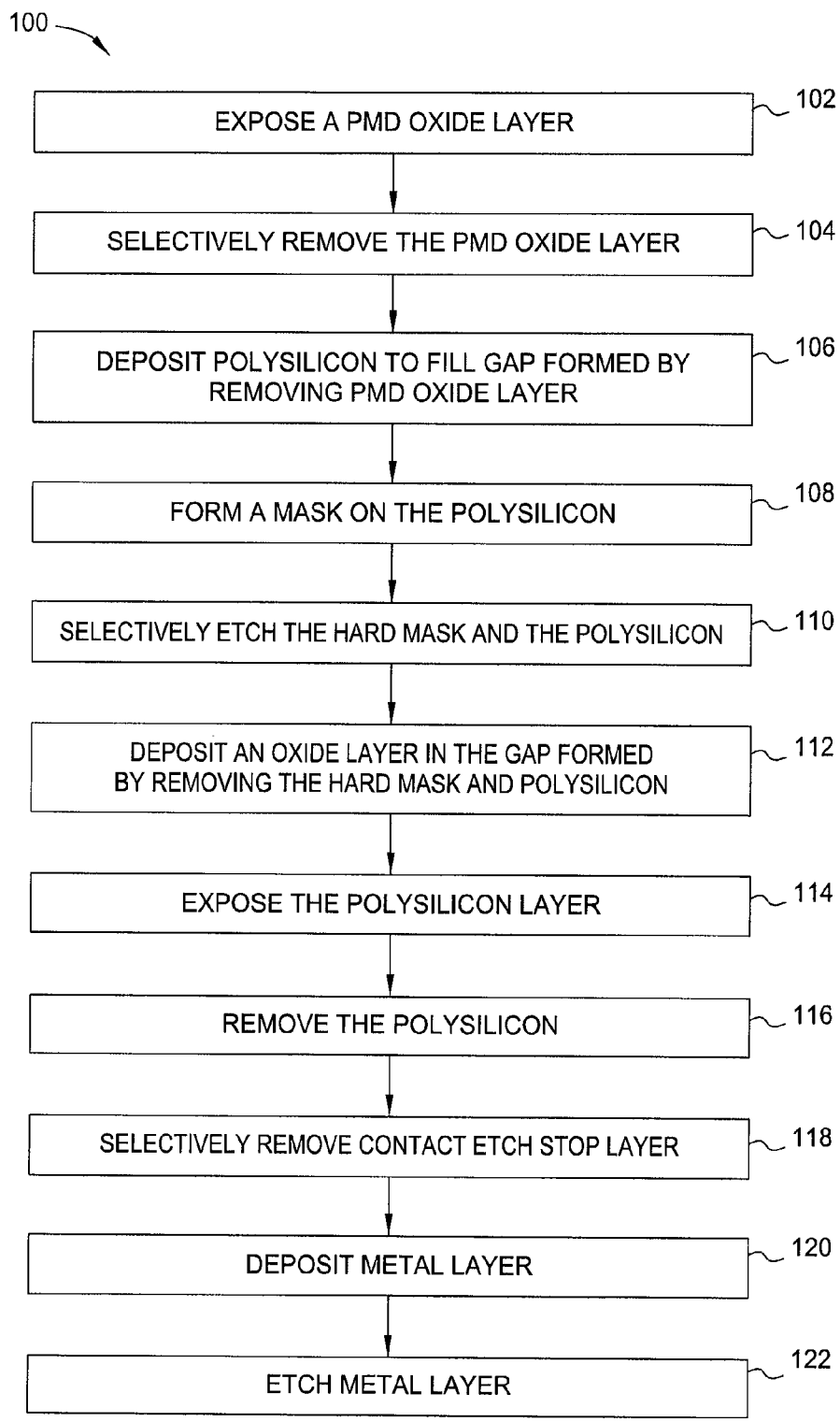
FIG. 1 illustrates a method of forming a semiconductor structure, according to one embodiment.
Figure 2A:
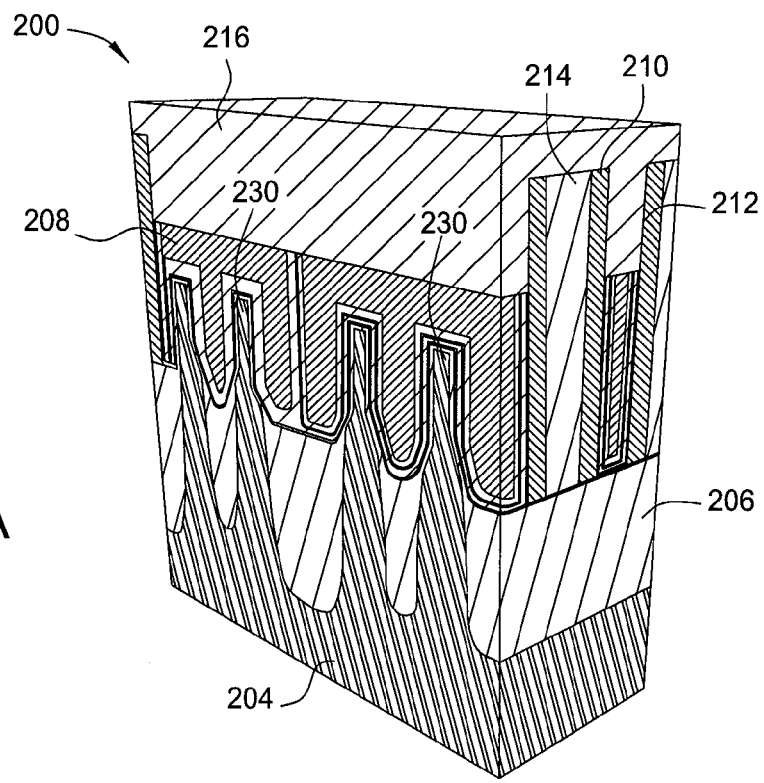
FIG. 2A-2L illustrates cross-sectional views of a semiconductor structure at different stages of the method of FIG. 1, according to one embodiment.

FIG. 1 illustrates a method 100 of forming a semiconductor structure, according to one embodiment. FIGS. 2A-2L illustrate cross-sectional views of a semiconductor structure 200 at different stages of the method 100 of FIG. 1. FIG. 2A illustrates a semiconductor structure 200, according to one embodiment. The semiconductor structure 200 includes a silicon layer 204. A shallow trench isolation (STI) oxide 206 may be formed in the silicon layer 204. A metal gate 208 may be disposed on the STI oxide 206. The metal gate 208 may be formed from suitable metals, such as titanium nitride and titanium aluminide, among others, and dielectric materials, such as hafnium dioxide, zirconium dioxide, titanium dioxide. A low-k (LK) spacer 210 may be deposited over the metal gate 208. A contact etch stop layer (CESL) 212 is deposited over the LK spacer 210. The CESL 212 may be an oxide or SiN. A pre-metal deposition (PMD) layer 214 may be deposited over the CESL 212. For example, the PMD layer 214 may be formed from a dielectric material. For example, the PMD layer 214 may be formed from an oxide, for example, deposited using a physical vapor deposition (PVD) process. A self-alignment contact (SAC) layer 216 may be formed on the PMD layer 214. The SAC layer 216 may be formed from SiN.

The method begins at block 102. At block 102, the PMD layer 214 is exposed by removing a portion of the SAC layer

Figure 2B:
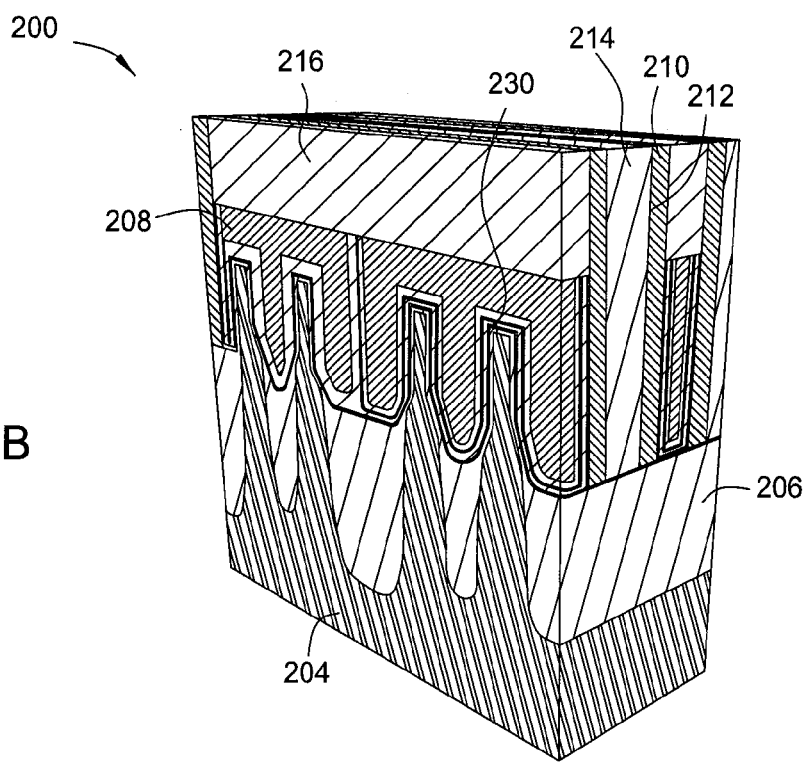

216, as shown in FIG. 2B. A chemical mechanical polishing (CMP) or etch back procedure may be used to expose the PMD layer 214.

Figures 2C, 2D:
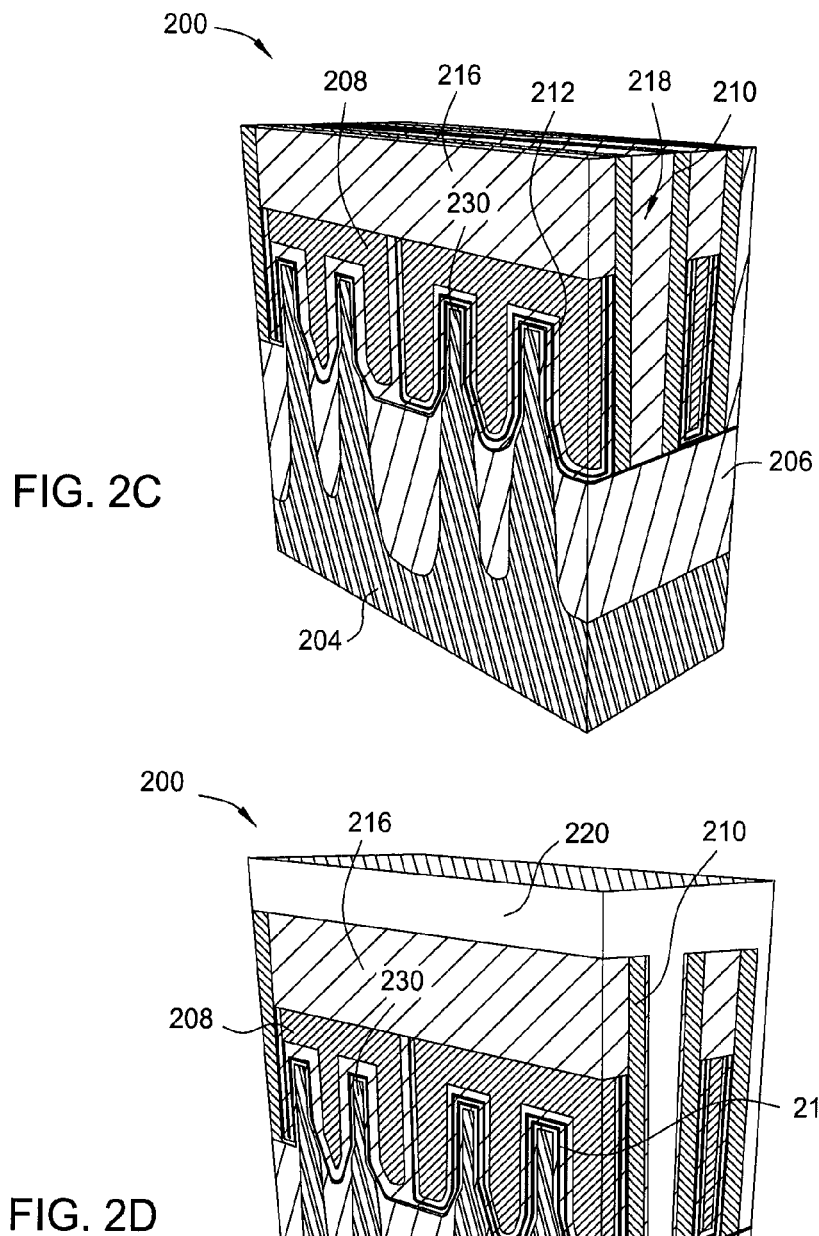

At block 104, the PMD oxide layer 214 is selectively removed from the semiconductor structure 200, as shown in FIG. 2C. The PMD oxide layer 214 may be removed using a low-energy etch process. The etch process is selective to preferentially remove the PMD oxide layer 214 relative to CESL 212. The low-energy etch process used to remove PMD oxide layer 214 does not substantially damage the sidewalls of the trench formed by the removal of the PMD oxide layer 214, thus maintaining good sidewall profiles and excellent dimensional control. For example, the PMD oxide layer 214 may be removed using fluorine or chlorine-containing precursor and a hydrogen-containing precursor. The fluorine or chlorine-containing precursor and the hydrogen-containing precursor form a remote plasma by applying RF power to the plasma region. For example, an RF power between about 10 Watts (W) and about 2000 W may be applied to the plasma region. The temperature of the semiconductor structure during the etching operation may be greater than or about 0° C. The pressure within the substrate processing region may be above or about 0.05 Torr and below or about 100 Torr. The PMD oxide layer 214 may be removed in a Frontier™ chamber, commercially available from Applied Materials, Inc., of Santa Clara, Calif. Removal of the PMD oxide layer 214 forms a trench defined by a gap 218.

At block 106, polysilicon 220 is deposited on the semiconductor structure 200, as shown in FIG. 2D. The polysilicon 220 is deposited on the SAC layer 216 and fills the gap 218 formed in block 104.

Figure 2E:
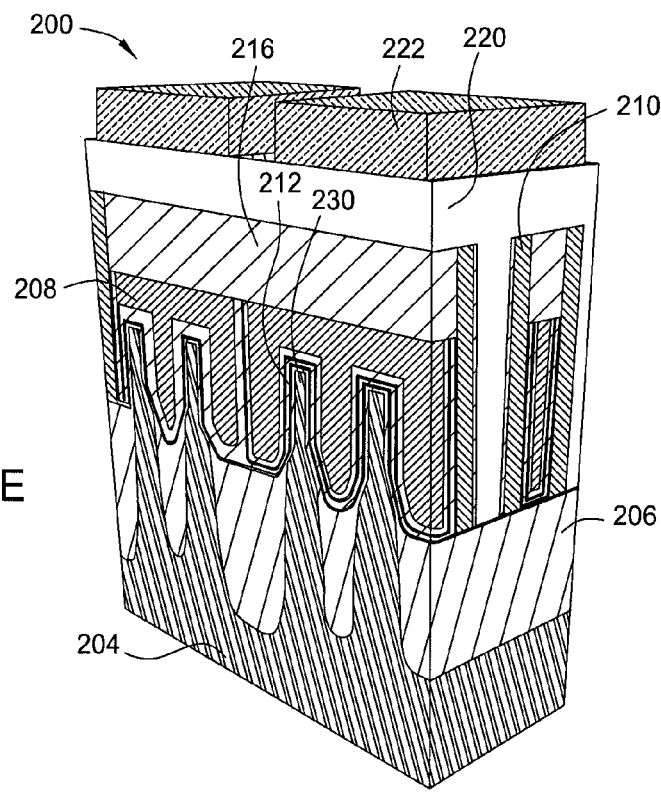
Figure 2F:
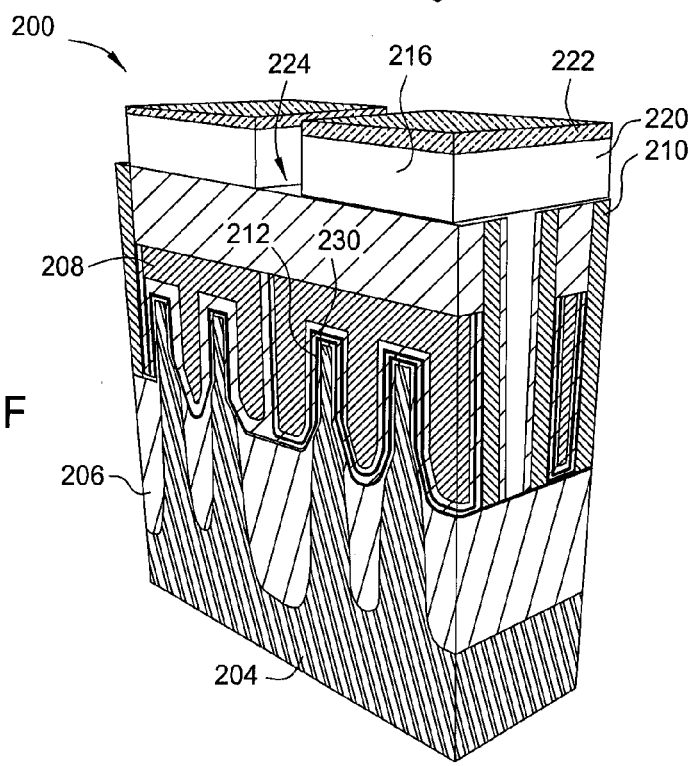

At block 108, a hard mask 222 is formed on the polysilicon 220, as shown in FIG. 2E. The hard mask 222 may be formed from a carbon containing material, such as tantalum containing material, a tantalum nitride containing material, a titanium containing material, a titanium nitride containing material, a tungsten containing material, a tungsten nitride containing material, and combinations and mixtures thereof At block 110, the hard mask 222 and the polysilicon 220 are selectively removed, as shown in FIG. 2F. For example, the hard mask 222 and the polysilicon 220 are selectively removed by reactive ion etch (RIE) process. For example, the hard mask 222 may be moved to a C3® chamber, commercially available from Applied Materials, Inc., of Santa Clara, Calif. Removing the hard mask 222 and the polysilicon 220 forms a gap 224 in the semiconductor structure 200.

Figure 2G:
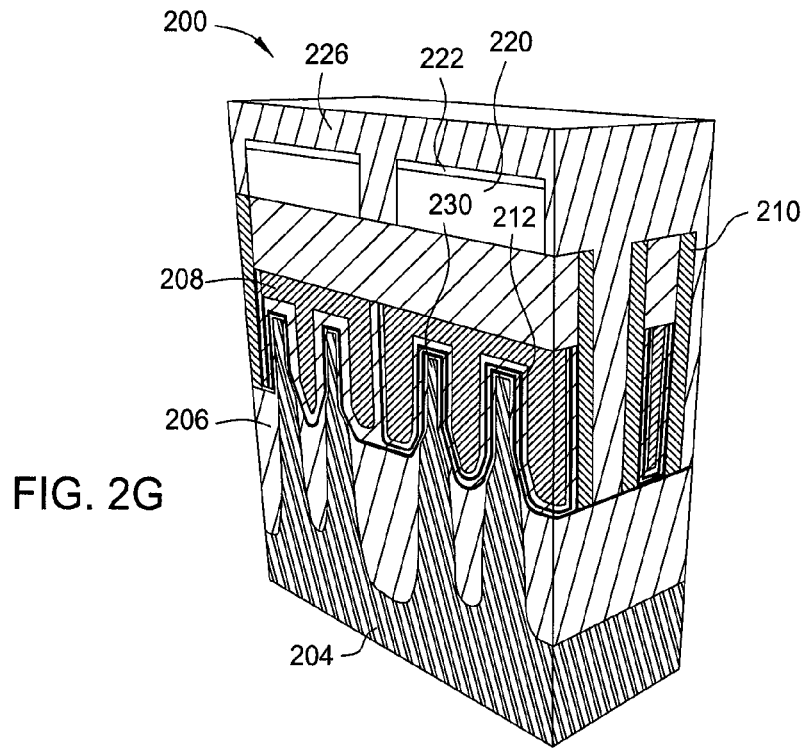

At block 112, an oxide layer 226 is deposited on the semiconductor structure 200, as shown in FIG. 2G. The oxide layer 226 fills the gap 224 formed in block 110. The oxide layer 226 may be deposited using a flowable CVD (FCVD) process. For example, the oxide layer 226 may be deposited in an FCVD system such as the Producer® Eterna™ FCVD™ system, commercially available from Applied Materials, Inc., of Santa Clara, Calif. The oxide layer 226 may be comprised of TEOS.

Figure 2H:
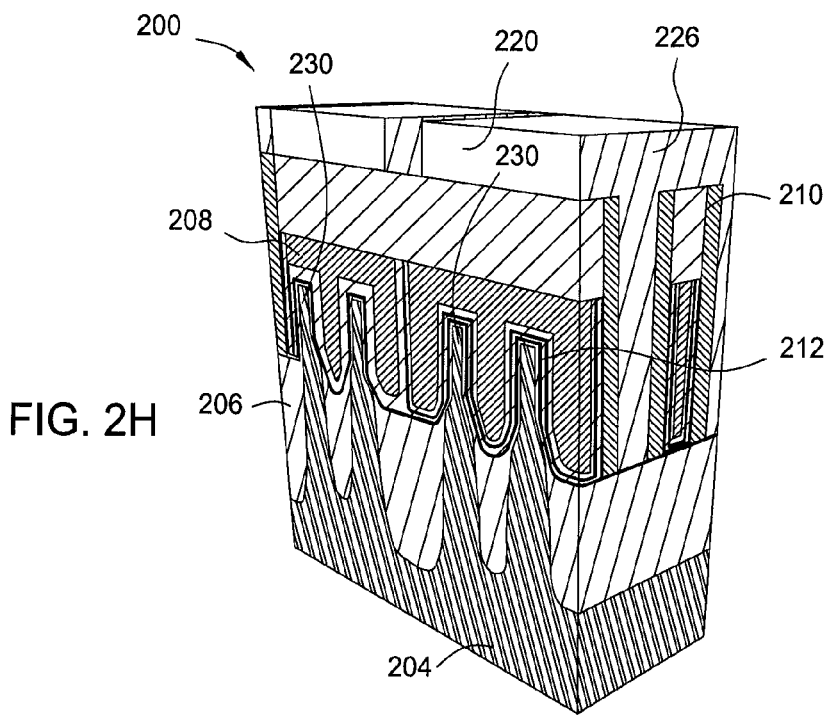

At block 114, the polysilicon layer 220 is exposed, as shown in FIG. 2H. The polysilicon layer 220 is exposed by removing the oxide layer 226 deposited in block 112. The oxide layer 226 may be removed through a CMP or etch back process.

Figure 2I:
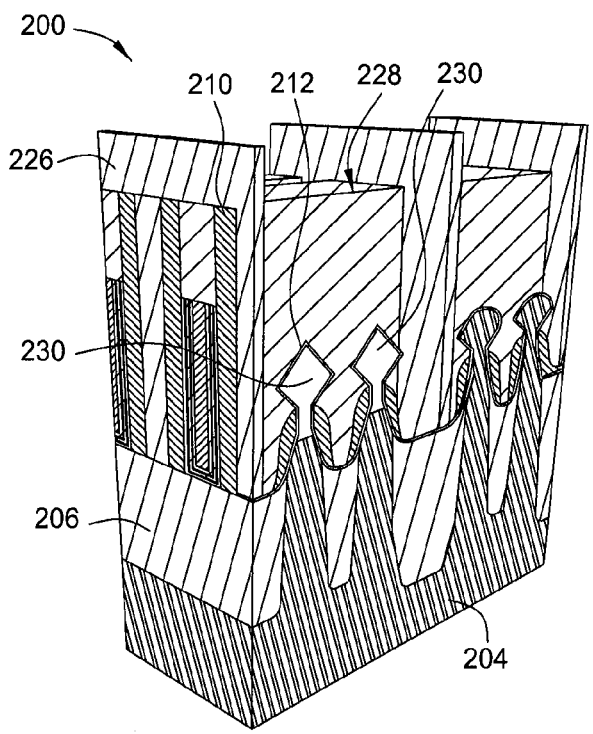

At block 116, the polysilicon layer 220 is selectively removed from the semiconductor structure 200, as shown in FIG. 2I. The polysilicon layer 220 may be removed using a low-energy etch process. The etch process is selective to preferentially remove the polysilicon layer 220 relative to CESL 212. The low-energy etch process used to remove the polysilicon layer 220 does not substantially damage the sidewalls of the trench formed by the removal of the polysilicon layer 220, thus maintaining good sidewall profiles and excellent dimensional control. For example, the polysilicon layer 220 may be removed using fluorine or chlorine-containing precursor and a hydrogen-containing precursor. The fluorine or chlorine-containing precursor and the hydrogen-containing precursor form a remote plasma by applying RF power to the plasma region. For example, an RF power between about 10 W and about 2000 W may be applied to the plasma region. The temperature of the semiconductor structure during the etching operation may be greater than or about 0° C. The pressure within the substrate processing region may be above or about 0.05 Torr and below or about 100 Torr. The PMD oxide layer 214 may be removed in the Frontier™ chamber. Removal of the polysilicon layer 220 forms a trench defined by a gap 228 in the semiconductor structure 200.

Figure 2J:
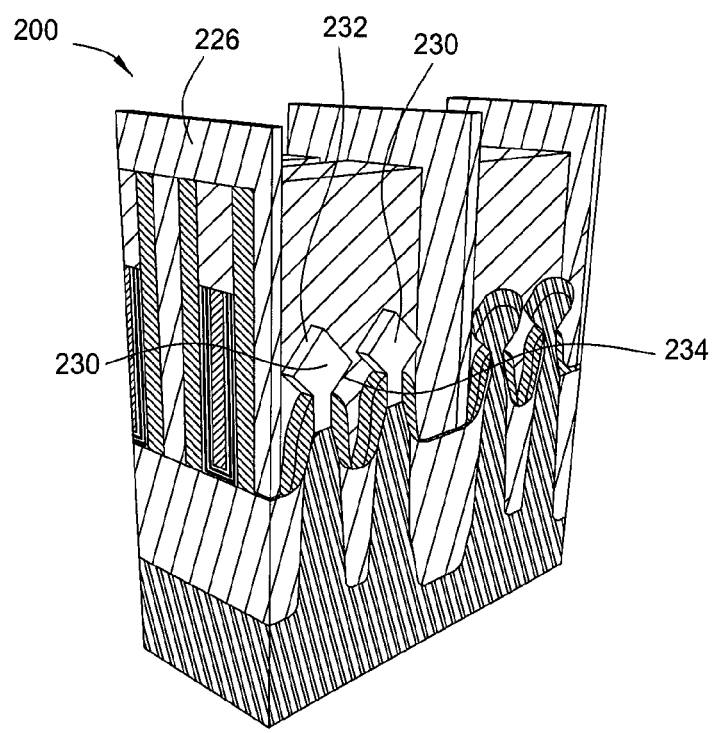

At block 118, the CESL 212 is selectively removed from the semiconductor structure 200, as shown in FIG. 2J. The CESL 212 may be removed using a low-energy etch process. The etch process is selective to preferentially remove the CESL 212 relative to the contacts 230. The low-energy etch process used to remove the CESL 212 does not substantially damage the sidewalls of the trench formed by the removal of CESL 212, thus maintaining good sidewall profiles and excellent dimensional control. For example, the CESL 212 may be removed using fluorine or chlorine-containing precursor and a hydrogen-containing precursor. The fluorine or chlorine-containing precursor and the hydrogen-containing precursor form a remote plasma by applying RF power to the plasma region. For example, an RF power between about 10 W and about 2000 W may be applied to the plasma region. The temperature of the semiconductor structure during the etching operation may be greater than or about 0° C. The pressure within the substrate processing region may be above or about 0.05 Torr and below or about 100 Torr. The CESL 212 may be removed in the Frontier™ chamber. Removal of the CESL 212 fully exposes contacts 230 in the structure 200. The use of the gentle etch process allows the CESL 212 to be removed both on top of and under the contacts 230. This results in a wrap-around contact. The wrap-around contact increases the surface area of the contacts 230. The increased surface area reduces the resistance of the contacts 230.

Figure 2K:
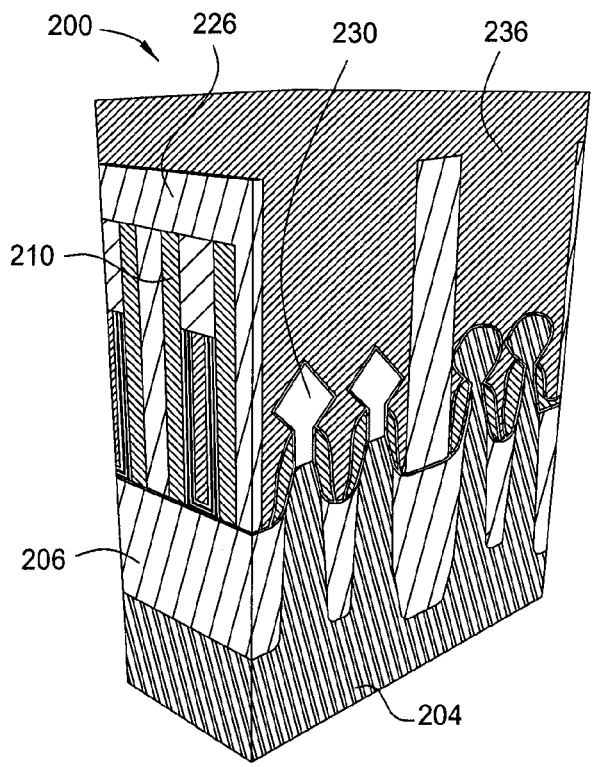

At block 120, the gap 228 formed by the removal of the PMD oxide layer 214 in block 116 and the CESL 212 in block 118 is filled with a metal layer 232, as shown in FIG. 2K. The metal layer 232 filling gap 228 may be TiN, W, Co, or other suitable metal.

Figure 2L:
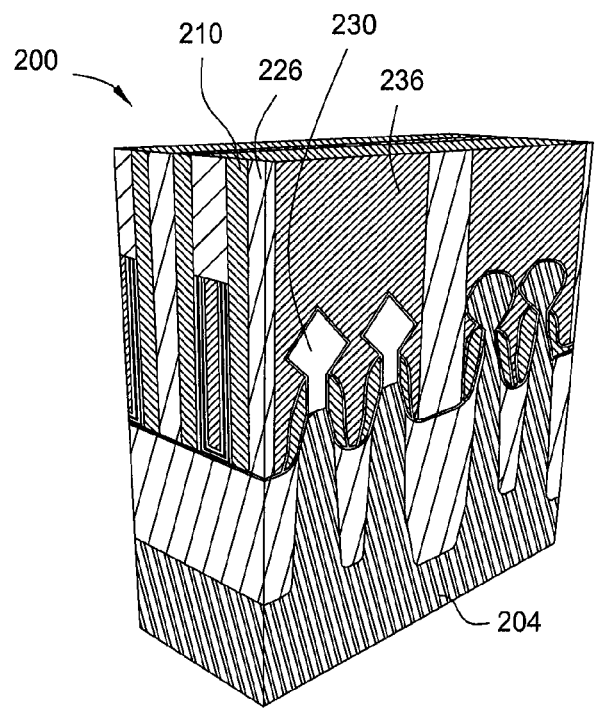

At block 122, the metal layer 236 is etched, as shown in FIG. 2L. The metal layer 232 may be etched to expose the SAC layer 216.

Using a low-energy etch process instead of a reactive ion etch process eliminates epi SiGe, SiP, or SiC loss during the reactive ion etch processes. The low-energy etch process also eliminates a contact etch SAC margin issue. All that is needed is a think SiN protective layer. The low-energy process minimizes the SiN sidewall loss due to the high selectivity of the process. The low-energy process results in easier integration for "wrap around contacts" in the semiconductor structure.

While the foregoing is directed to specific embodiments, other and further embodiments may be devised without departing from the basic scope thereof, and the scope thereof is determined by the claims that follow.

What is claimed is:

1. A method of forming a semiconductor structure, comprising:
   exposing an oxide layer of the semiconductor structure;
   depositing a polysilicon layer on the semiconductor structure, filling a first gap formed by exposing the oxide layer;
   depositing a hard mask on the polysilicon layer;
   selectively removing the hard mask and the polysilicon layer;
   depositing an oxide layer on the semiconductor structure, filling a second gap formed by selectively removing the hard mask and polysilicon layer;
   exposing the polysilicon layer deposited on the semiconductor structure;
   selectively removing the polysilicon layer from the first gap using a fluorine or chlorine-containing precursor and a hydrogen-containing precursor; and
   selectively removing an etch stop layer from a surface of a contact in the semiconductor structure, using a fluorine or chlorine-containing precursor and a hydrogen-containing precursor.

2. The method of claim 1, wherein the semiconductor structure includes a plurality of contacts.

3. The method of claim 1, wherein selectively removing an etch stop layer from a surface of a contact in the semiconductor structure, using a fluorine or chlorine-containing precursor and a hydrogen-containing precursor comprises:
   exposing a top and bottom surface of the contact.

4. The method of claim 1, wherein depositing an oxide layer on the semiconductor structure, filling a second gap formed by selectively removing the hard mask and polysilicon layer, comprises:
   performing a flowable chemical vapor deposition process.

5. The method of claim 1, wherein selectively removing the hard mask and the polysilicon layer, comprises:
   performing a reactive ion etch process.

6. The method of claim 1, wherein selectively removing the polysilicon layer from the first gap using a fluorine or chlorine-containing precursor and a hydrogen-containing precursor, comprises:
   applying RF power between about 10 W and 2000 W.

7. The method of claim 1, further comprising:
   depositing a metal layer in a third gap formed by selectively removing the polysilicon layer and selectively removing the etch stop layer.

8. The method of claim 7, further comprising:
   etching the metal layer down to a self-alignment contact layer.

9. A semiconductor structure, comprising:
   a silicon layer having a shallow trench isolation oxide formed therein;
   a plurality of contacts positioned above the silicon layer, each contact having a top surface and a second surface exposed such that a metal layer may contact the top surface and the second surface of the contact, and each contact having a third surface contacting the silicon layer; and
   a metal gate disposed over the shallow trench isolation oxide, the metal gate formed from a metal and a dielectric material.

10. The semiconductor structure of claim 9, wherein the metal layer is selected from the group consisting of TiN, Co, and W.

11. The semiconductor structure of claim 9, wherein the metal layer is chosen from the group consisting of titanium nitride, titanium aluminide, and other titanium alloys, and wherein the dielectric material is chosen from the group consisting of hafnium dioxide, zirconium dioxide, and titanium dioxide.

12. The semiconductor structure of claim 9, wherein the top surface and the second surface are exposed from selectively removing a polysilicon layer and an etch stop layer from the semiconductor structure.

13. The semiconductor structure of claim 12, wherein the polysilicon layer and the etch stop layer are removed using a fluorine or chlorine-containing precursor and a hydrogen-containing precursor.

14. The semiconductor structure of claim 13, wherein RF power between 10 W and 2000 W is applied.

15. A method forming a semiconductor structure comprising:
   forming a plurality of wrap-around contacts by selectively removing a polysilicon layer and an etch stop layer from the semiconductor structure using a fluorine or chlorine-containing precursor and a hydrogen-containing precursor and exposing a top surface and a bottom surface of a contact in the semiconductor structure.

16. The method of claim 15, wherein the metal layer is selected from the group consisting of TiN, Co, and W.

17. The method of claim 15, further comprising:
   depositing a metal layer on the wrap-around contact.

18. The method of claim 17, wherein the metal layer contacts the top surface and the bottom surface of the contact.

19. The method of claim 17, further comprising:
   applying RF power between about 10 W and 2000 W.

20. The method of claim 17, wherein the plurality of wrap-around contacts include an exposed top and bottom surface.

* * * * *